United States Patent
Lai

(10) Patent No.: US 8,424,744 B2
(45) Date of Patent: Apr. 23, 2013

(54) METHOD OF MANUFACTURING LED LIGHT BAR AND MANUFACTURING EQUIPMENT THEREOF

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/209,453

(22) Filed: Aug. 15, 2011

(65) Prior Publication Data

US 2012/0175404 A1    Jul. 12, 2012

(30) Foreign Application Priority Data

Jan. 11, 2011   (TW) .............................. 100100882 A

(51) Int. Cl.
*B23K 37/04* (2006.01)
*B23K 37/047* (2006.01)
*H05K 3/00* (2006.01)

(52) U.S. Cl.
USPC .......... 228/44.3; 228/44.7; 228/47.1; 438/27; 269/903; 29/739

(58) Field of Classification Search ................. 228/44.3, 228/44.7, 47.1; 29/729, 739, 740; 269/903; 438/27

See application file for complete search history.

(56) References Cited

U.S. PATENT DOCUMENTS

| 3,313,395 | A  | * | 4/1967  | Turris et al. ................... 414/787 |
| 6,010,061 | A  | * | 1/2000  | Howell ..................... 228/180.21 |
| 6,581,278 | B2 | * | 6/2003  | Kay ............................... 29/830 |
| 6,983,532 | B2 | * | 1/2006  | White ............................. 29/740 |
| 2002/0146657 | A1 | * | 10/2002 | Anderson et al. ............... 432/11 |
| 2011/0180588 | A1 | * | 7/2011  | Nagao .......................... 228/6.2 |

* cited by examiner

*Primary Examiner* — Devang R Patel
(74) *Attorney, Agent, or Firm* — Altis Law Group, Inc.

(57) ABSTRACT

A manufacturing equipment for manufacturing an LED light bar includes a reflow oven and a clamping device. The LED light bar includes a printed circuit board and a plurality of LEDs arranged on the printed circuit board. The reflow oven includes a hearth box and a transmitting belt extended through the hearth box. The hearth box includes a heating area and a cooling area in an interior thereof. The clamping device is mounted on the transmitting belt. The clamping device defines a receiving space for receiving the LED light bar therein. The clamping device is changed between a clamping state for maintaining the LEDs in positions and a releasing state whereby the LED light bar can be removed from the clamping device.

13 Claims, 4 Drawing Sheets

METHOD OF MANUFACTURING LED LIGHT BAR AND MANUFACTURING EQUIPMENT THEREOF

BACKGROUND

1. Technical Field

The disclosure relates to method of manufacturing semiconductor, and particularly to a method of manufacturing LED light bar and a manufacturing equipment thereof.

2. Description of the Related Art

Light emitting diodes (LEDs) have many advantages, such as high luminosity, low power consumption, compatibility with integrated circuits, easy driving, long term reliability, and environmental friendliness. These advantages have promoted wide use of the LEDs as a light source. Now, LEDs are commonly applied in lighting.

A conventional LED light bar includes a printed circuit board and a plurality of LEDs mounted on the printed circuit board. When manufacturing the LED light bar, the LEDs are arranged on the printed circuit board in a line with a layer of solder paste applied therebetween; then, the printed circuit board with the LEDs thereon is conveyed through a reflow oven for a reflowing process, thereby enabling the solder paste to first melt and then solidify to fix the LEDs on the printed circuit board.

However, in the reflowing process, the molten solder paste may cause the LEDs which are regularly arranged on the printed circuit board to float and drift. Thus, relative positions between the LEDs and the print circuit board after the reflowing process are usually become deviated from the norm, causing the light bar unable to meet customer's requirement and influencing an overall performance of the light bar.

What is desired, therefore, is a method of manufacturing LED light bar and a manufacturing equipment which can overcome the above-described shortcomings.

DETAILED DESCRIPTION

Reference will now be made to the figures to describe various embodiments of the present method of manufacturing LED light bar and manufacturing equipment thereof in detail.

Figure 1:
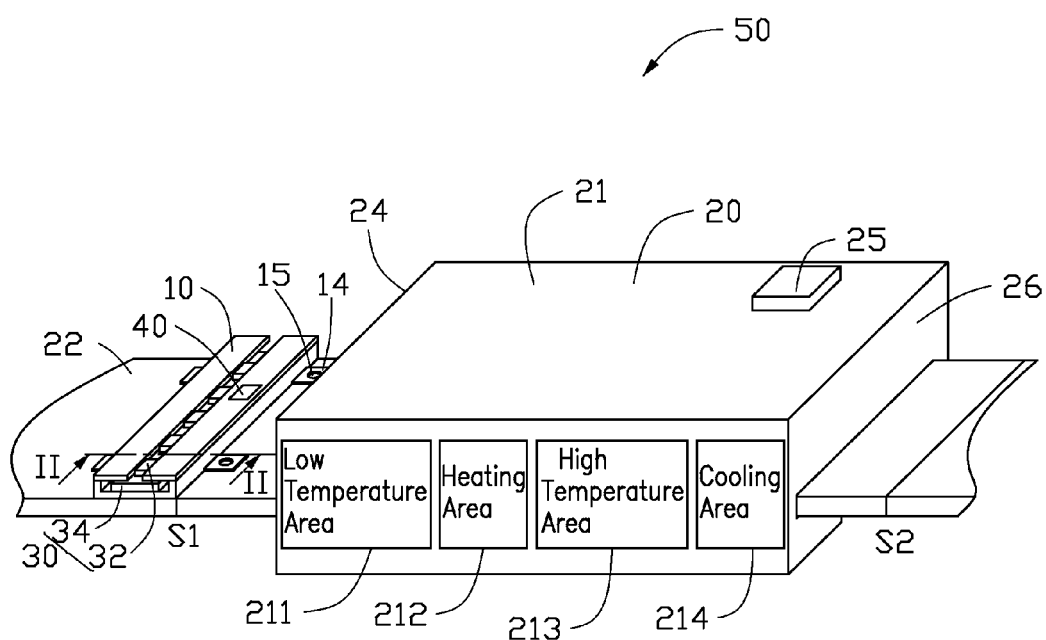
FIG. 1 is a schematic, assembled view of a manufacturing equipment for manufacturing an LED light bar according to an exemplary embodiment of the present disclosure, wherein the manufacturing equipment includes a reflow oven, a clamping device and a position sensor, and a semi-finished LED light bar is positioned in the clamping device.

Referring to FIG. 1, a manufacturing equipment 50 for manufacturing an LED light bar 30 in accordance with an exemplary embodiment includes a reflow oven 20, a clamping device 10 and a position sensor 40. The LED light bar 30 includes a printed circuit board 34 and a plurality of LEDs 32 mounted on the printed circuit board 34 in a line.

The reflow oven 20 includes a hearth box 21, a transmitting belt 22 extended through the hearth box 21 and a control unit 25. The hearth box 21 defines an entrance 24 and an exit 26 at two opposite ends thereof. The hearth box 21 includes a low temperature area 211, a heating area 212, a high temperature area 213 and a cooling area 214 arranged in sequence in an interior of the hearth box 21 from the entrance 24 to the exit 26. Each of the low temperature area 211, the heating area 212, the high temperature area 213 and the cooling area 214 has substantially the same width to each other. The control unit 25 can be exemplarily mounted on one side of the hearth box 21.

Figure 2:
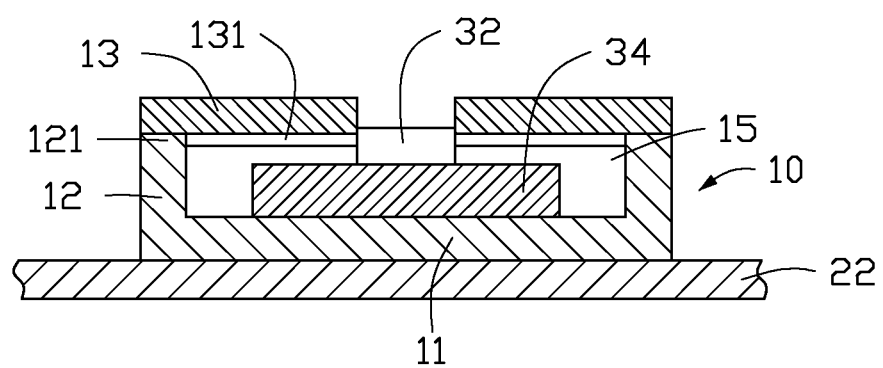
FIG. 2 is a cross section of the semi-finished LED light bar and the clamping device of FIG. 1, taken along line II-II thereof.
Figure 3:
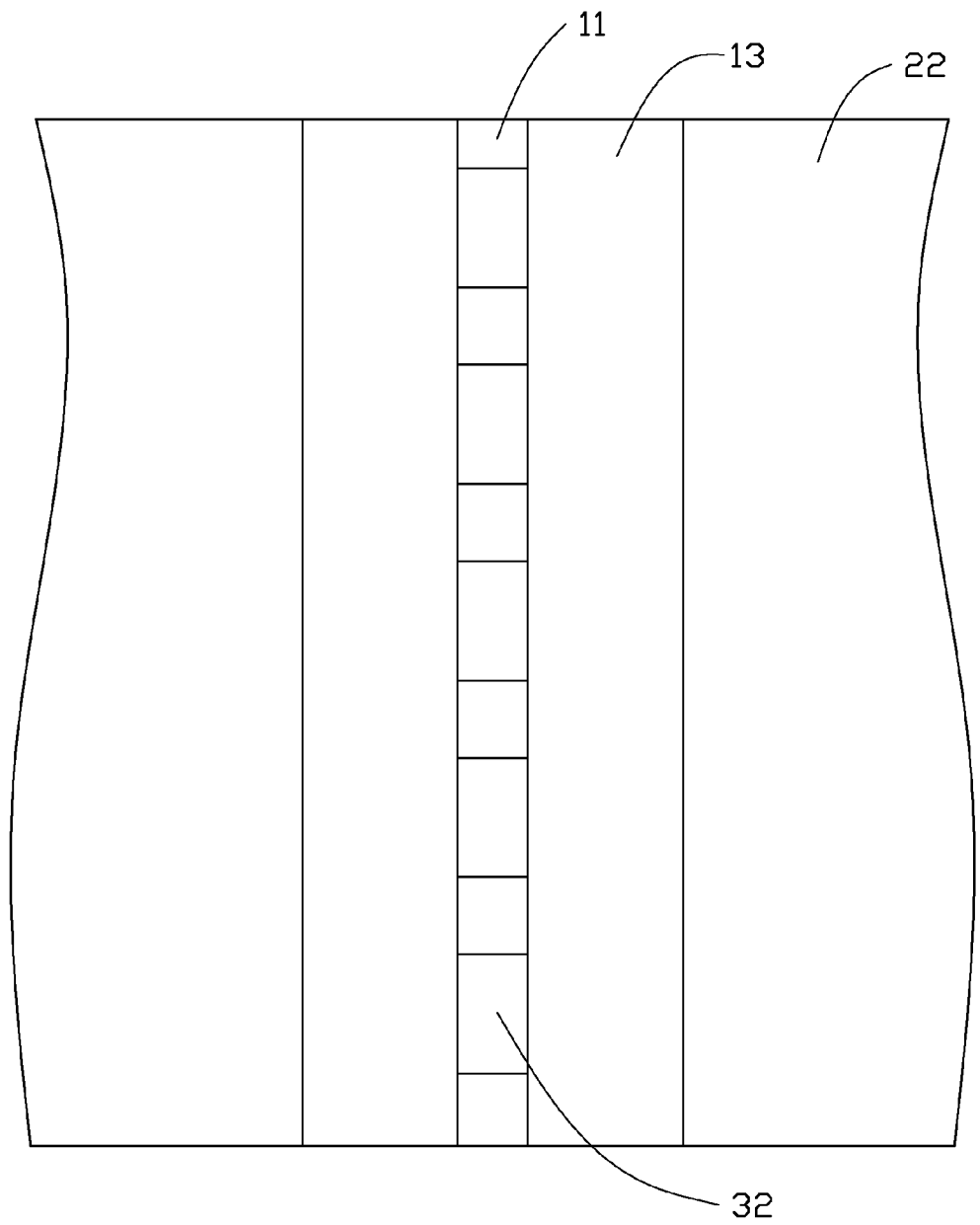
FIG. 3 is an enlarged top view of a part of the semi-finished LED light bar and the clamping device and a transmitting belt of the manufacturing equipment of FIG. 1.

Referring also to FIGS. 2 and 3, the clamping device 10 includes an elongated supporting plate 11, two connecting plates 12 extending upward from two opposite sides of the supporting plate 11, respectively, and two clamping arms 13 connected with top ends of the connecting plates 12, respectively. The clamping arms 13 extend from the top ends of the connecting plates 12 toward each other.

The supporting plate 11 has a length substantially equal to a width of the transmitting belt 22, and a width smaller than that of the low temperature area 211, the heating area 212, the high temperature area 213 and the cooling area 214 of the hearth box 21. The connecting plates 12 extend upward from two long sides of the supporting plate 11, respectively. A distance between the two connecting plates 12 is larger than a width of the printed circuit board 34. The supporting plate 11 and the connecting plates 12 cooperatively define a receiving space 15 for receiving the LED light bar 30 therein.

Each of the connecting plates 12 includes a plurality of protruding blocks 121 extending from the top end towards the other connecting plate 12. The protruding blocks 121 are equally spaced from each other along a lengthwise direction of the supporting plate 11. Each of the clamping arms 13 defines a plurality of recesses 131 at a bottom side thereof corresponding to the protruding blocks 121 of a corresponding connecting plate 12. When assembled, the clamping arms 13 are connected with the connecting plates 12 via the protruding blocks 121 engaged in the recesses 131, respectively.

The clamping arms 13 are horizontally moveable with respect to the connecting plates 12 via the protruding blocks 121 slide along a corresponding recess 131 along a widthwise direction of the supporting plate 11. The clamping arms 13 are moved between a clamping state whereby distal ends of the clamping arms 13 abutting against two opposite sides of the LEDs 32 such that positions of the LEDs 32 on the printed circuit board 34 are maintained at a required position. The clamping arms 13 are parallel to each other. The clamping device 10 connects with the control unit 25, and is moved between the clamping state and the releasing state under control of the control unit 25. A distance defined between the clamping arm 13 and the printed circuit board 34 of the light bar 31 is substantially equal to a half of a height of the LED 32.

Referring back to FIG. 1, the position sensor 40 is mounted on a top surface of the clamping device 10. The position sensor 40 can detect a position of the LED light bar 30 in real time when the LED light bar 30 is moved with the transmitting belt 22, and output a signal which contains position message of the LED light bar 30 to the control unit 25. In this embodiment, when the position sensor 40 detects that the LED light bar 30 has reached a first predetermined position S1, i.e., the entrance 24 of the reflow oven 20, the position sensor 40 outputs a first signal to the control unit 25, such that the control unit 25 controls the clamping device 10 to move to the clamping state. When the position sensor 40 detects that the LED light bar 30 has reached a second predetermined position S2, i.e., the exit 26 of the reflow oven 20, the position sensor 40 outputs a second signal to the control unit 25, such that the control unit 25 controls the clamping device 10 to move to the releasing state. Alternatively, the first predetermined position S1 can be any positions before the heating area 211, and the second predetermined position S2 can be any positions after the cooling area 214.

Figure 4:
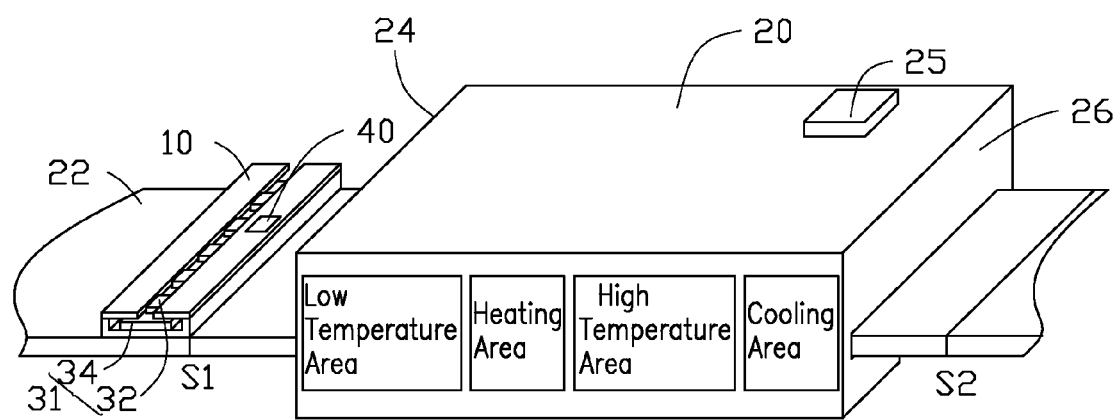
FIG. 4 is a schematic view showing one stage in an exemplary method of manufacturing an LED light bar according to an exemplary embodiment of the present disclosure.

Referring to FIG. 4, a method of manufacturing the LED light bar 30 using the manufacturing equipment 50 described above is shown. The method includes following step.

The first step is providing the reflow oven 20 and the clamping device 10; the clamping device 10 is located on the transmitting belt 22 of the reflow oven 20 with the two long sides thereof perpendicular to two opposite sides of the transmitting belt 22.

The second step is mounting a semi-finished LED light bar 31 in the receiving space 15 of the clamping device 10; the semi-finished LED light bar 31 includes the printed circuit board 34 with the LEDs 32 arranged in a line on the printed circuit board 34 and a layer of solder paste applied between the LEDs 32 and the printed circuit board 34;

The third step is starting the transmitting belt 22, whereby the clamping device 10 and the semi-finished LED light bar 31 carried by the transmitting belt 22 move together through the reflow oven 20. During this step, when the clamping device 10 and the semi-finished LED light bar 31 together reach the first predetermined position S1, the position sensor 40 outputs the first signal to the control unit 25 to thereby control the clamping device 10 to move to the clamping state. Because the first predetermined position S1 is before the heating area 211, when the clamping device 10 and the semi-finished LED light bar 31 together reach the heating area 211 where the solder paste is to be heated to melt, the clamping device 10 is in the clamping state such that the LEDs 32 are respectively held in position by the clamping arms 13 of the clamping device 10.

When the clamping device 10 and the semi-finished LED light bar 31 together reach the second predetermined position S2, the position sensor 40 outputs the second signal to the control unit 25 to thereby control the clamping device 10 to move to the releasing state. The second predetermined position S2 is after the cooling area 214. When the clamping device 10 and the semi-finished LED light bar 31 has passed the cooling area 214, the melted solder paste is solidified to fix the LEDs 32 on the printed circuit board 34 to form the finished LED light bar 30. Thus, at the second predetermined position S2, the clamping device 10 is moved to the releasing state so that the finished LED light bar 30 can be removed from the clamping device 10.

In the process of manufacturing the LED light bar 30, the clamping device 10 is used to hold the LEDs 32 in position during the reflowing process. Thus, relative position between each of the LEDs 32 and the print circuit board 34 can be maintained during the manufacturing method of the LED light bar 30, to thereby improve quality of the finished LED light bar 30.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method of manufacturing an LED light bar, the method comprising:

providing a reflow oven and a clamping device mounted on a transmitting belt of the reflow oven, the reflow oven comprising a heating area and a cooling area in an interior thereof;

providing a semi-finished LED light bar comprising a printed circuit board and a plurality of LEDs arranged on the print circuit board with solder paste applied between the LEDs and the printed circuit board, and mounting the semi-finished LED light bar in the clamping device; and starting the reflow oven and thus the transmitting belt carrying the clamping device and the semi-finished LED light bar moving together to pass through the reflow oven, whereby the solder paste is firstly melted in the heating area and then solidified in the cooling area to fix the LEDs on the printed circuit board to form the LED light bar;

wherein when the clamping device and the semi-finished LED light bar reach a first predetermined position before the heating area, the clamping device is at a clamping state for maintaining relative positions between the LEDs and the printed circuit board; and when the clamping device and the semi-finished LED light bar reach a second predetermined position after the cooling area, the clamping device is changed to a releasing state such that the LED light bar can be removed from the clamping device;

wherein the clamping device comprises a supporting plate, a plurality of connecting plates extending upward from the supporting plate and a plurality of clamping arms connected with the connecting plates, respectively, the supporting plate, the connecting plates and the clamping arms cooperatively defining a receiving space for receiving the semi-finished LED light bar therein; and wherein a plurality of protruding blocks and a plurality of recesses corresponding to the protruding blocks respectively are formed between the connecting plates and the clamping arms, the clamping arms connected with the connecting plates via the protruding blocks engaged in the recesses, the clamping arms being moveable with respect to the connecting plates via the protruding blocks sliding along the recesses.

2. The method of claim 1, wherein the protruding blocks are formed at top ends of the connecting plates, and the recesses are defined in bottom sides of the clamping arms.

3. The method of claim 1, wherein when the clamping device is at the clamping state, the clamping arms are moved toward each other to abut against the LEDs, and when the clamping device is at the releasing state, the clamping arms are moved away from each other to space from the LEDs.

4. The method of claim 1, wherein a distance defined between each of the clamping arms and the printed circuit board is substantially equal to a half of height of each of the LEDs.

5. The method of claim 1, wherein the reflow oven further comprises a hearth box defining an entrance and an exit at two opposite ends thereof, the entrance is the first predetermined position, and the exit is the second predetermined position.

6. The method of claim 5, further comprising a control unit and a position sensor for detecting a position of the clamping device and outputting a control signal to the control unit, the control unit controlling the clamping device to change between the clamping state and the releasing state according to the control signal received from the position sensor.

7. Equipment for manufacturing a light emitting diode (LED) light bar, the LED light bar comprising a printed circuit board and a plurality of LEDs arranged on the printed circuit board, the equipment comprising:

a reflow oven comprising a hearth box and a transmitting belt extended through the hearth box, the hearth box comprising a heating area and a cooling area in an interior thereof; and a clamping device mounted on the transmitting belt, the clamping device defining a receiving space for receiving the LED light bar therein, the clamping device being changeable between a clamping state for maintaining the LEDs in position and a releasing state whereby the LED light bar can be removed from the clamping device;

wherein the clamping device comprises a supporting plate, a plurality of connecting plates extending upward from the supporting plate, and a plurality of clamping arms connected with the connecting plates, respectively, the supporting plate, the connecting plates and the clamping arms cooperatively defining the receiving space; and wherein a plurality of protruding blocks and a plurality of recesses corresponding to the protruding blocks, respectively, are formed between the connecting plates and the clamping arms, the clamping arms connected with the connecting plates via the protruding blocks engaged in the recesses, and the clamping arms being moveable with respect to the connecting plates via the protruding blocks sliding along the recesses.

8. The equipment of claim 7, wherein the protruding blocks are formed at top ends of the connecting plates, and the recesses are defined in bottom sides of the clamping arms.

9. The equipment of claim 7, wherein when the clamping device is at the clamping state, the clamping arms are adjacent to each other to abut against the LEDs; and when the clamping device is at the releasing state, the clamping arms are away from each other to space from the LEDs.

10. The equipment of claim 7, wherein a distance defined between each of the clamping arms and the printed circuit board of the LED light bar is substantially equal to a half of a height of each of the LEDs.

11. The equipment of claim 7, further comprising a control unit and a position sensor for detecting a position of the clamping device and outputting a control signal to the control unit, the control unit controlling the clamping device to change between the clamping state and the releasing state according to the control signal received from the position sensor.

12. The equipment of claim 11, wherein when the clamping device reaches a first predetermined position before the heating area, the clamping device is at the clamping state; and when the clamping device reaches a second predetermined position after the cooling area, the clamping device is changed to the releasing state.

13. The equipment of claim 12, wherein the hearth box defines an entrance and an exit at two opposite ends thereof, the entrance is the first predetermined position, and the exit is the second predetermined position.

* * * * *